US011137525B2

(12) United States Patent
Suzuki

(10) Patent No.: US 11,137,525 B2
(45) Date of Patent: Oct. 5, 2021

(54) DISPLAY DEVICE AND MANUFACTURING METHOD THEREOF

(71) Applicant: Japan Display Inc., Tokyo (JP)

(72) Inventor: Takayasu Suzuki, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 16/866,557

(22) Filed: May 5, 2020

(65) Prior Publication Data

US 2020/0264342 A1    Aug. 20, 2020

Related U.S. Application Data

(63) Continuation of application No. PCT/JP2018/031176, filed on Aug. 23, 2018.

(30) Foreign Application Priority Data

Nov. 20, 2017   (JP) .............................. JP2017-222724

(51) Int. Cl.
*G06F 1/16* (2006.01)
*H05K 5/00* (2006.01)
(Continued)

(52) U.S. Cl.
CPC ............. *G02B 1/14* (2015.01); *G06F 1/1609* (2013.01); *H01L 51/5262* (2013.01); *H01L 51/56* (2013.01)

(58) Field of Classification Search
CPC ... G02B 1/14; G02B 1/12; G02B 1/16; G02B 1/18; G02B 1/10; G02B 1/08;
(Continued)

(56) References Cited

U.S. PATENT DOCUMENTS 10,541,380 B1 *   1/2020  Sung .................. H01L 21/76205
2020/0110495 A1 *   4/2020  Han ....................... G06F 3/0412
(Continued)

FOREIGN PATENT DOCUMENTS

JP          07-114034 A      5/1995
JP          2007-264242 A    10/2007
JP          2009-169034 A    7/2009

OTHER PUBLICATIONS

International Search Report and Written Opinion dated Nov. 20, 2018 for PCT/JP2018/031176 filed on Aug. 23, 2018, 8 pages including English Translation of the International Search Report.

*Primary Examiner* — Anthony M Haughton
(74) *Attorney, Agent, or Firm* — Xsensus LLP

(57) ABSTRACT

A display device includes a plurality of layers stacked such that outer edges thereof coincide with each other at both ends in at least one of a first direction and a second direction that are orthogonal to each other and each layer including holes communicating in the stacking direction at a plurality of positions, and a resin continuously filled in the holes over the entirety of the plurality of layers. The plurality of layers include a display panel including a display area. The display panel includes the corresponding holes outside the display area. The holes of the plurality of layers are displaced in a plan view, as compared with the matching accuracy of the outer edges.

9 Claims, 6 Drawing Sheets

(51) Int. Cl.
*H05K 7/00* (2006.01)
*G02B 1/14* (2015.01)
*H01L 51/52* (2006.01)
*H01L 51/56* (2006.01)

(58) Field of Classification Search
CPC .... G06F 1/1609; G06F 1/1601; G06F 1/1613; H01L 51/5262; H01L 51/56
See application file for complete search history.

(56) References Cited

U.S. PATENT DOCUMENTS

| | | | |
|---|---|---|---|
| 2020/0176538 A1* | 6/2020 | Um | H01L 27/3272 |
| 2020/0176709 A1* | 6/2020 | Moon | H01L 51/5253 |
| 2020/0266255 A1* | 8/2020 | Jung | H01L 27/3258 |
| 2020/0295112 A1* | 9/2020 | Kim | H01L 51/56 |
| 2020/0381486 A1* | 12/2020 | Jeong | G06F 3/0412 |
| 2020/0403180 A1* | 12/2020 | Seon | H01L 27/3244 |
| 2021/0057490 A1* | 2/2021 | Choi | H01L 27/322 |
| 2021/0111367 A1* | 4/2021 | Choi | H01L 27/323 |

* cited by examiner

DISPLAY DEVICE AND MANUFACTURING METHOD THEREOF

CROSS-REFERENCE TO RELATED APPLICATION

This application is a continuation application of International Application PCT/JP2018/031176 filed on Aug. 23, 2018, which claims priority from Japanese patent application JP2017-222724 filed on Nov. 20, 2017. The contents of these applications are incorporated herein by reference in their entirety.

BACKGROUND

1. Field

The present invention relates to a display device and a manufacturing method thereof.

2. Description of the Related Art

On the display panel, a separate member such as a sheet, a film, or a substrate may be stacked as a plurality of layers. JP 2009-169034 A, JP 2007-264242 A and JP H07-114034 A disclose that a plurality of members are fixed with screws or pins. Since the screws and pins are inserted into the holes, if the positions of the holes are displaced, the outer edges of the plurality of layers are displaced.

In a mobile device such as a smartphone, in order to reduce the size of the housing (to increase the display area relatively), high accuracy is required for positioning the display panel built in the housing and the outer edges of the plurality of layers. However, there is a limit in reducing the error of the hole, and the demand needs to be met in another method.

SUMMARY

An object of the present invention is to improve positioning accuracy.

A display device according to the present invention includes a plurality of layers stacked such that outer edges thereof coincide with each other at both ends in at least one of a first direction and a second direction that are orthogonal to each other, and each layer including holes communicating with each other in the stacking direction at a plurality of positions; and a resin continuously filled in the holes over the entirety of the plurality of layers, in which the plurality of layers include a display panel including a display area, the display panel includes the corresponding holes outside the display area, and the holes of the plurality of layers are displaced in a plan view, as compared with the matching accuracy of the outer edges.

According to the present invention, by the resin, even if the holes of the plurality of layers are positioned in a state of being displaced, the outer edges thereof coincide with each other, and therefore, high positioning accuracy is obtained.

A manufacturing method of a display device according to the present invention includes a step of stacking a plurality of layers such that outer edges thereof coincide with each other at both ends in at least one of a first direction and a second direction that are orthogonal to each other, and holes at a plurality of positions included in each layer communicate with each other in the stacking direction, a step of continuously filling the holes with a resin over the entirety of the plurality of layers, and a step of curing the resin, in which the plurality of layers include a display panel including a display area, the display panel includes the corresponding holes outside the display area, and the holes of the plurality of layers are displaced in a plan view, as compared with the matching accuracy of the outer edges.

According to the present invention, since a resin is used, even if the holes of a plurality of layers are displaced, high positioning accuracy can be obtained so that the outer edges thereof coincide with each other.

DETAILED DESCRIPTION

Figure 1:
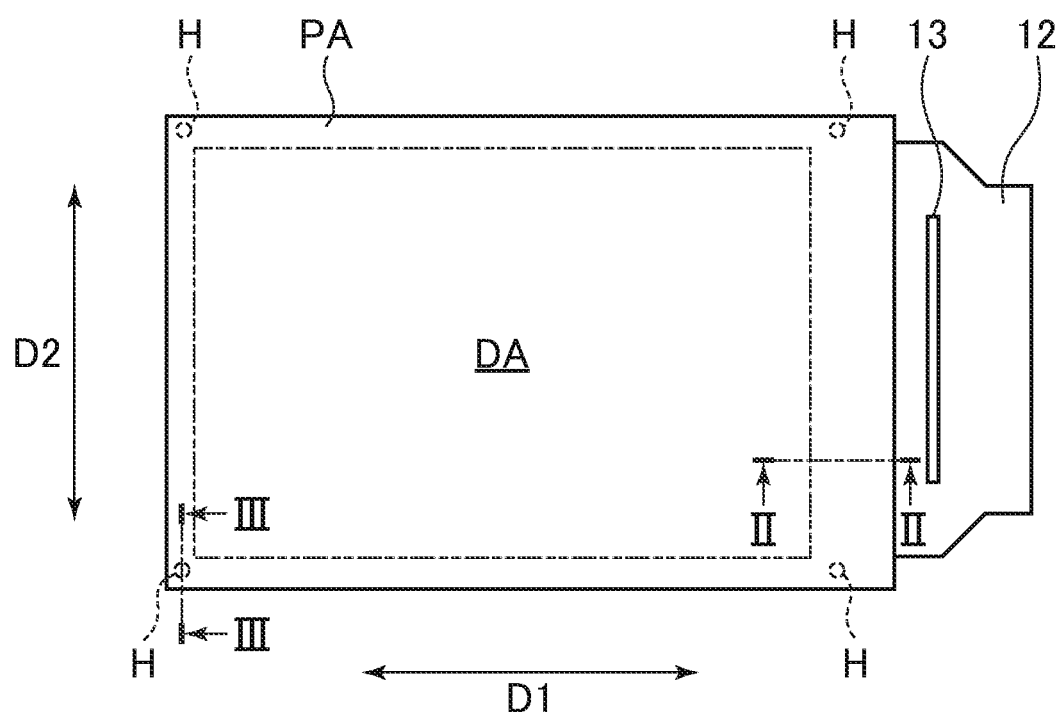
FIG. 1 is a plan view of a display device according to an embodiment of the present invention.

Hereinafter, embodiments of the present invention will be described with reference to the drawings. However, the present invention can be carried out in various modes without departing from the gist of the present invention, and is not to be construed as being limited to the description of the embodiments exemplified below.

The drawings may be schematically illustrated in terms of width, thickness, shape, and the like of each portion as compared with actual embodiments in order to make the description clearer, but are merely examples, and are not intended to limit the interpretation of the present invention. In the specification and the drawings, elements having the same functions as those described in relation to the already described drawings are denoted by the same reference numerals, and the redundant description may be omitted.

Furthermore, in the detailed description of the present invention, when defining the positional relationship between a certain component and another component, the terms "above" and "below" include not only the case where located directly above or below the certain component, but also the case where other components are further interposed therebetween unless otherwise specified.

Figure 2:
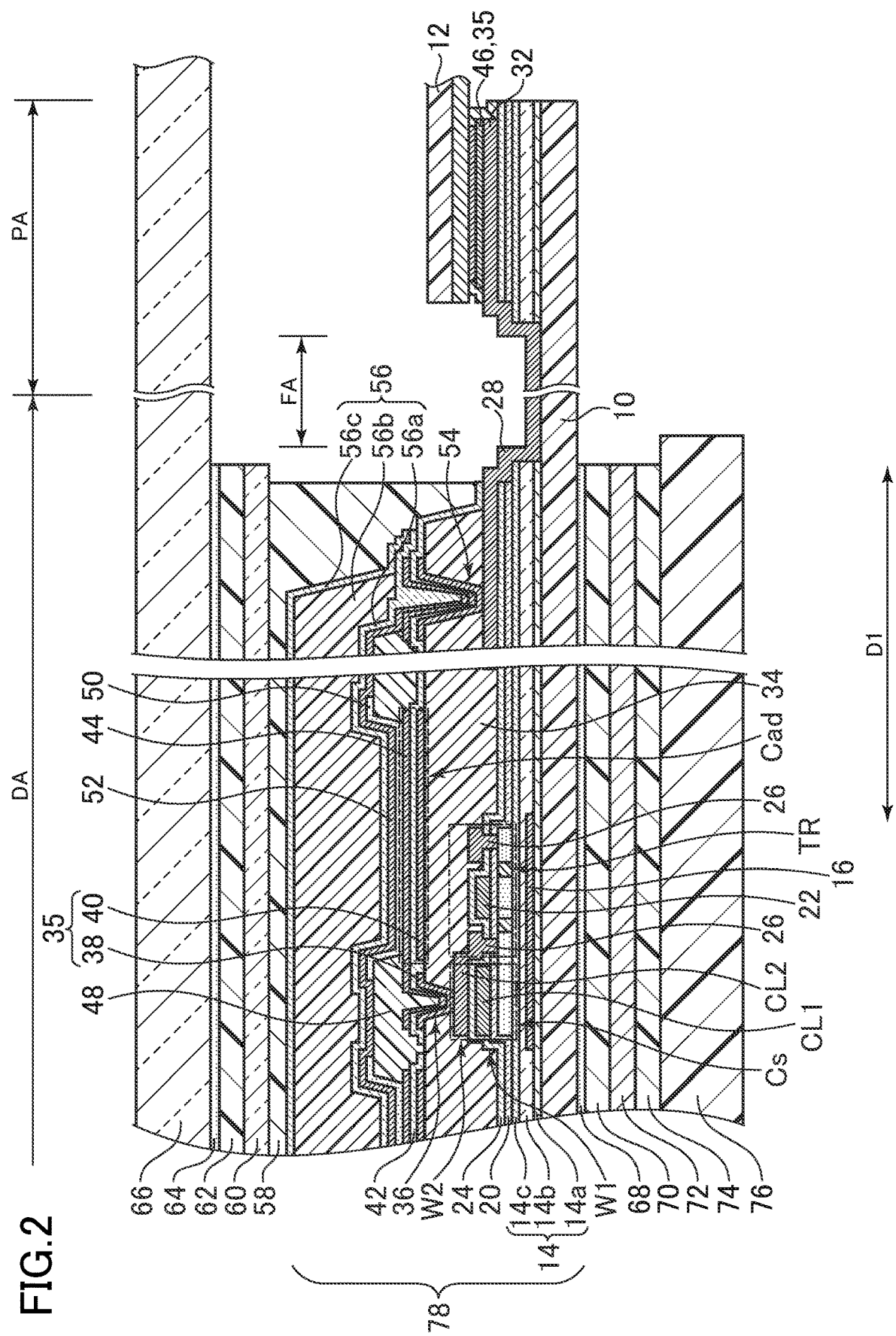
FIG. 2 is an enlarged view of a cross section taken along line II-II of the display device shown in FIG. 1.

FIG. 1 is a plan view of a display device according to an embodiment of the present invention. FIG. 2 is an enlarged view of a cross section taken along line II-II of the display device shown in FIG. 1.

The display device is an organic Electroluminescence (EL) display device. The display device is configured to form a full-color pixel by combining unit pixels (sub-pixels) of a plurality of colors including red, green, and blue, and display a full-color image. The display device includes a display area DA and a peripheral area PA surrounding the display area DA. The peripheral area PA is outside the display area DA. A flexible printed circuit board 12 is connected to the peripheral area PA. An integrated circuit 13 for driving an element for displaying an image is mounted on the flexible printed circuit board 12.

As a substrate 10 (array substrate), polyimide is used. However, another resin material may be used as long as the material has sufficient flexibility to constitute a sheet display or a flexible display. On the substrate 10, a three-layer stacked structure of a silicon oxide film 14a, a silicon nitride film 14b, and a silicon oxide film 14c is provided as an undercoat layer 14. The lowermost silicon oxide film 14a is provided for improving the adhesion to the substrate 10, the intermediate silicon nitride film 14b is provided as a block film against moisture and impurities from the outside, and the uppermost silicon oxide film 14c is provided as a block film for preventing hydrogen atoms contained in the silicon nitride film 14b from diffusing to a semiconductor layer 18 side of a thin film transistor TR. However, the structure is not particularly limited to this structure, and may be further stacked, or may be a single layer or a two-layer stack.

Under the undercoat layer 14, an additional film 16 may be formed at a position where the thin film transistor TR is formed. The additional film 16 can suppress a change in the characteristics of the thin film transistor TR due to the intrusion of light from the back surface of the channel, or can give a back gate effect to the thin film transistor TR by being formed of a conductive material and giving a predetermined potential. Here, after forming the silicon oxide film 14a, the additional film 16 is formed in an island shape in accordance with the position where the thin film transistor TR is to be formed, and then the silicon nitride film 14b and the silicon oxide film 14c are stacked, and thus, the additional film 16 is formed to be sealed in the undercoat layer 14. The present invention is not limited thereto. The additional film 16 may be first formed on the substrate 10, and then the undercoat layer 14 may be formed.

The thin film transistor TR is formed on the undercoat layer 14. Only an Nch transistor is illustrated here by taking a polysilicon thin film transistor as an example, but a Pch transistor may be formed at the same time. The semiconductor layer 18 of the thin film transistor TR has a structure in which a low-concentration impurity region is provided between a channel region and a source and drain region. Here, a silicon oxide film is used as a gate insulating film 20. A gate electrode 22 is a part of a first wiring layer W1 formed of MoW. The first wiring layer W1 includes a first storage capacitance line CL1 in addition to the gate electrode 22. Apart of a storage capacitor Cs is formed between the first storage capacitance line CL1 and the semiconductor layer 18 (source and drain region) via the gate insulating film 20.

On the gate electrode 22, an interlayer insulating film 24 (silicon oxide film or silicon nitride film) is stacked. When allowing the substrate 10 to be bent, at least a part of the interlayer insulating film 24 is removed in a bending area FA to be easily bent. Since the undercoat layer 14 is exposed by removing the interlayer insulating film 24, at least apart thereof is also removed by patterning. After removing the undercoat layer 14, the polyimide constituting the substrate 10 is exposed. In some cases, the polyimide surface may be partially eroded through etching of the undercoat layer 14 to reduce the film thickness.

On the interlayer insulating film 24, a second wiring layer W2 including a portion serving as a source and drain electrode 26 and a routing wiring 28 is formed. Here, a three-layer stacked structure of Ti, Al, and Ti is employed. The first storage capacitance line CL1 (part of the first wiring layer W1) and a second storage capacitance line CL2 (part of the second wiring layer W2) form a part of another storage capacitor Cs via the interlayer insulating film 24.

The routing wiring 28 extends to an end of the substrate 10 to include a terminal 32 for connecting the flexible printed circuit board 12.

A planarizing film 34 is provided to cover the source and drain electrode 26 and the routing wiring 28 (except for a part thereof). As the planarizing film 34, an organic material such as photosensitive acrylic is often used because the organic material has better surface planarization than an inorganic insulating material formed by chemical vapor deposition (CVD) or the like.

The planarizing film 34 is removed at a pixel contact portion 36 and the peripheral area PA, and an indium tin oxide (ITO) film 35 is formed thereon. The indium tin oxide film 35 includes a first transparent conductive film 38 and a second transparent conductive film 40 separated from each other.

The second wiring layer W2 whose surface is exposed by removing the planarizing film 34 is covered with the first transparent conductive film 38. A silicon nitride film 42 is provided on the planarizing film 34 to cover the first transparent conductive film 38. The silicon nitride film 42 has an opening in the pixel contact portion 36, and a pixel electrode 44 is stacked so as to be conducted to the source and drain electrode 26 through the opening. The pixel electrode 44 is formed as a reflective electrode and has a three-layer stacked structure of an indium zinc oxide (IZO) film, a silver (Ag) film, and an indium zinc oxide film. Here, an indium tin oxide film 35 may be used instead of the indium zinc oxide film. The pixel electrode 44 extends laterally from the pixel contact portion 36 and reaches above the thin film transistor TR.

The second transparent conductive film 40 is provided adjacent to the pixel contact portion 36, below the pixel electrodes 44 (further below the silicon nitride film 42). The second transparent conductive film 40, the silicon nitride film 42, and the pixel electrode 44 are overlapped to form an additional capacitor Cad.

On the surface of the terminal 32, a third transparent conductive film 46 which is another part of the indium tin oxide film 35 is formed. The third transparent conductive film 46 is formed simultaneously with the first transparent conductive film 38 and the second transparent conductive film 40. The third transparent conductive film 46 on the terminal 32 is provided as a barrier film so that an exposed portion of the terminal 32 is not damaged in a subsequent process. At the time of patterning the pixel electrode 44, the third transparent conductive film 46 is exposed to an etching environment. However, the indium tin oxide film 35 has sufficient resistance to the etching of the pixel electrode 44 by an annealing process performed between the formation of the indium tin oxide film 35 and the formation of the pixel electrode 44.

On the planarizing film 34, for example, above the pixel contact portion 36, an insulating layer 48 which is called a bank (rib) and serves as a partition between adjacent pixel regions is formed. As the insulating layer 48, photosensitive acrylic or the like is used similarly to the planarizing film 34. The insulating layer 48 is opened to expose the surface of the pixel electrode 44 as a light emitting region, and the opening end preferably has a gentle taper shape. If the opening end has a steep shape, poor coverage of an organic electro luminescence (EL) layer 50 formed thereon will occur.

The planarizing film 34 and the insulating layer 48 are in contact through an opening provided in the silicon nitride film 42 therebetween. Thus, moisture and gas desorbed and degassed from the planarizing film 34 can be extracted through the insulating layer 48 by heat treatment or the like after the formation of the insulating layer 48.

The organic EL layer 50 made of an organic material is stacked on the pixel electrode 44. The organic EL layer 50 may be a single layer, or may have a structure in which a hole transport layer, a light emitting layer, and an electron transport layer are sequentially stacked from the pixel electrode 44 side. These layers may be formed by vapor deposition, may be formed by coating over a solvent dispersion, or may be formed selectively with respect to the pixel electrode 44 (each sub-pixel). Alternatively, these layers may be formed by solid formation on the entire surface covering the display area DA. In the case of solid formation, white light can be obtained in all sub-pixels, and a desired color wavelength portion can be extracted by a color filter (not illustrated).

A counter electrode 52 is provided on the organic EL layer 50. Here, the counter electrode 52 is transparent due to the top emission structure. For example, the Mg layer and the Ag layer are formed as films thin to an extent that transmits light emitted from the organic EL layer 50. According to the above-described order of forming the organic EL layer 50, the pixel electrode 44 serves as an anode and the counter electrode 52 serves as a cathode. The counter electrode 52 is formed over the display area DA and over a cathode contact portion 54 provided near the display area DA. The counter electrode 52 is connected to the lower routing wiring 28 at the cathode contact portion 54 and electrically connected to the terminal 32.

A sealing film 56 is formed on the counter electrode 52. One function of the sealing film 56 is to prevent the previously formed organic EL layer 50 from the intrusion of moisture from the outside, and a high gas barrier property is required. Here, the stacked structure including the silicon nitride film is a stacked structure of a silicon nitride film 56a, an organic resin layer 56b, and a silicon nitride film 56c. A silicon oxide film or an amorphous silicon layer may be provided between the silicon nitride films 56a and 56c and the organic resin layer 56b for the purpose of improving adhesion.

A touch panel substrate 60 is stacked on the sealing film 56 via an adhesive layer 58. At least a part of a touch sensing electrode (not shown) is formed on the touch panel substrate 60. Apart of the touch sensing electrode may be shared by the counter electrode 52. A circularly polarizing plate 62 is attached to the touch panel substrate 60. A cover glass 66 is stacked on the circularly polarizing plate 62 via an adhesive layer 64. On the other hand, a support film 70 is stacked on the substrate 10 via an adhesive layer 68. On the support film 70, a heat equalizing sheet 72 made of graphite or the like, a cushion sheet 74, and a housing 76 are stacked.

Figure 3:
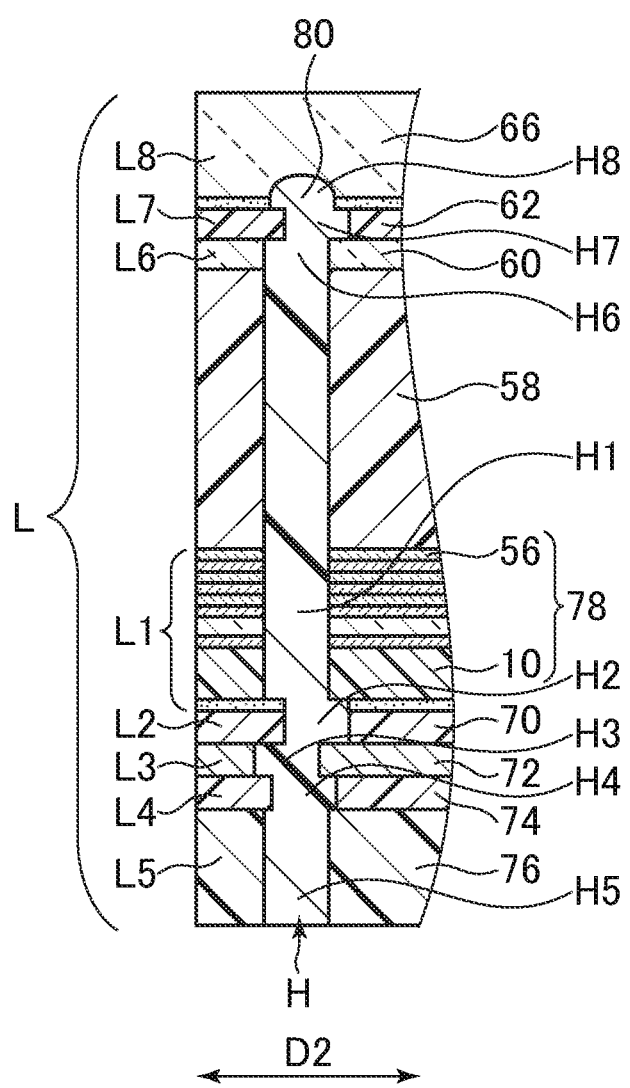
FIG. 3 is an enlarged view of a cross section taken along line III-III of the display device shown in FIG. 1.

FIG. 3 is an enlarged view of a cross section taken along line III-III of the display device shown in FIG. 1. The display device includes a plurality of layers L. The plurality of layers L include a layer L1 corresponding to a display panel 78 including the display area DA. The layer L1 includes the layers from the substrate 10 to the sealing film 56 shown in FIG. 2. The plurality of layers L include layers L2, L3, L4, and L5 respectively corresponding to the support film 70, the heat equalizing sheet 72, the cushion sheet 74, and the housing 76 below the display panel 78. The plurality of layers L include layers L6, L7, and L8 respectively corresponding to the touch panel substrate 60, the circularly polarizing plate 62, and the cover glass 66 on the display panel 78. The outermost layers L8 and L5 are the cover glass 66 and the housing 76, respectively.

The plurality of layers L are stacked so that the outer edges thereof coincide with each other at both ends in at least one (for example, only one) of a first direction D1 and a second direction D2 that are orthogonal to each other. For example, as shown in FIG. 1, a connecting direction between the display panel 78 and the flexible printed circuit board 12 is the first direction D1, and a direction orthogonal to the first direction is the second direction D2. As shown in FIGS. 1 and 3, the outer edges of the plurality of layers L coincide with each other at both ends in the second direction D2. On the other hand, as shown in FIG. 2, at the right end in the first direction D1, not all the outer edges of the plurality of layers L coincide with each other, but some outer edges of the plurality of layers L may coincide with each other. Further, at the end (not shown) opposite to the side shown in FIG. 2, all the outer edges of the plurality of layers L may coincide with each other.

Each of the plurality of layers L (L1 to L8) includes holes H (H1 to H8) communicating with each other in the stacking direction at a plurality of positions. The layer L1 including the display panel 78 includes a hole H1 outside the display area DA (see FIG. 1). On the other hand, the layers L1 to L7 except for the outermost layer L8 (cover glass 66) include through-holes as the holes H1 to H7. The cover glass 66 (layer L8) includes a concave portion as the hole H8. The concave portion opens toward another layer L7.

Since the hole H is formed by a laser or the like, displacement and unevenness in size occur. On the other hand, since the plurality of layers L are aligned at the outer edges, the holes H of the plurality of layers L are displaced in a plan view as compared with the matching accuracy of the outer edges. For example, the holes H of the plurality of layers L are displaced at least at one of the center and the inner surface.

The holes H are continuously filled with a resin 80 over the entirety of the plurality of layers L. Since the resin 80 is cured, the plurality of layers L are connected to each other. According to the present embodiment, by the resin 80, even if the holes H of the plurality of layers L are positioned in a state of being displaced, the outer edges thereof coincide with each other, and therefore, high positioning accuracy is obtained.

Next, a manufacturing method of the display device according to the present embodiment will be described with reference to FIGS. 1 to 3. In the present embodiment, the plurality of layers L are prepared. The plurality of layers L include the display panel 78 including the display area DA. Each of the plurality of layers L includes the hole H. The display panel 78 includes the hole H outside the display area DA.

The plurality of layers L are stacked so that the outer edges thereof coincide with each other at both ends in at least one of the first direction D1 and the second direction D2 that are orthogonal to each other. At this time, the holes H at a plurality of positions included in each layer are communicated in the stacking direction. The holes H in the plurality of layers L are displaced as compared with the matching accuracy of the outer edges.

The holes H are continuously filled with the resin 80 over the entirety of the plurality of layers L. The resin 80 is filled in a liquid, gel or paste form. Then, the resin 80 is cured. According to the present embodiment, since the resin 80 is used, even if the holes H of the plurality of layers L are displaced, high positioning accuracy can be obtained so that the outer edges thereof coincide with each other.

Figure 4:
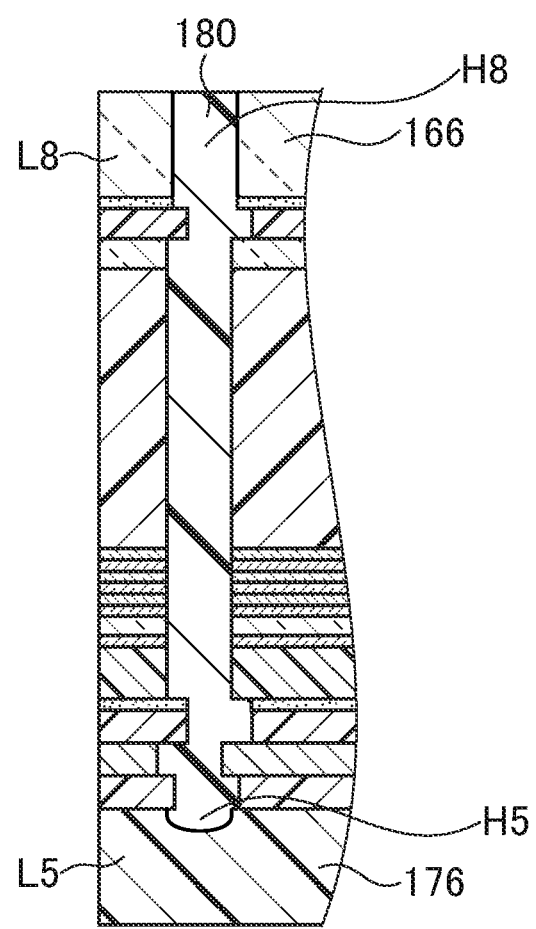
FIG. 4 is a cross-sectional view illustrating a display device according to a first modification of the embodiment.

FIG. 4 is a cross-sectional view illustrating a display device according to a first modification of the embodiment.

In this example, the hole H8 formed in a cover glass 166 (layer L8) is a through-hole, and the hole H5 formed in a housing 176 (layer L5) is a concave portion, contrary to the example of FIG. 3. In the manufacturing process, a resin 180 is filled from the hole H8 of the cover glass 166 (layer L8). The hole H8 of the cover glass 166 (layer L8) is preferably hidden by providing a decorative panel thereon or painting.

Figure 5:
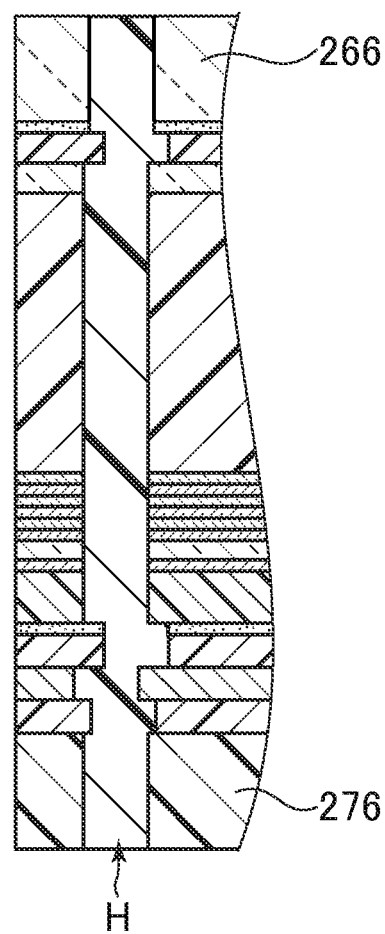
FIG. 5 is a cross-sectional view illustrating a display device according to a second modification of the embodiment.

FIG. 5 is a cross-sectional view illustrating a display device according to a second modification of the embodiment. In this example, each of the plurality of layers L includes a through-hole as the hole H. That is, the holes H formed in a cover glass 266 and a housing 276 are also through-holes.

Figure 6:
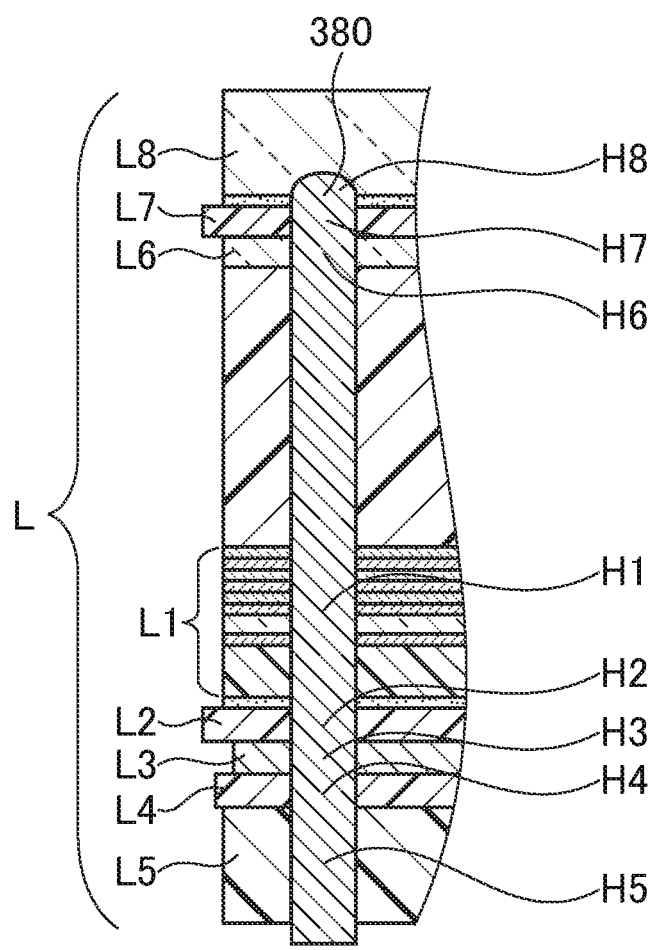
FIG. 6 is a cross-sectional view illustrating a display device according to a comparative example.

FIG. 6 shows, as a comparative example of FIG. 3, an example in which the holes H1 to H8 provided in each of the layers L1 to L8 of the plurality of layers L are supported and fixed by a metal pin 380 or the like passing therethrough. In this case, since the holes H1 to H8 are aligned by the metal pin 380, the ends of the layers L1 to L8 are relatively displaced. The direction of the displacement depends on the processing accuracy of the holes H1 to H8 in each of the layers L1 to L8, and therefore is not in one direction. As a result, the displacement of each of the layers L1 to L8 occurs in various directions, which becomes a factor of increasing the outer shape error after assembly.

The display device is not limited to the organic electroluminescence display device, and may be a display device including a light emitting element such as a quantum-dot light emitting diode (QLED) in each pixel, or a liquid crystal display device.

While there have been described what are at present considered to be certain embodiments, it will be understood that various modifications may be made thereto, and it is intended that the appended claims cover all such modifications as fall within the true spirit and scope of the invention.

What is claimed is:

1. A display device comprising:
   a plurality of layers stacked such that outer edges thereof coincide with each other at both ends in at least one of a first direction and a second direction that are orthogonal to each other, and each layer including holes communicating with each other in the stacking direction at a plurality of positions; and
   a resin continuously filled in the holes over the entirety of the plurality of layers, wherein
   the plurality of layers include a display panel including a display area,
   the display panel includes the corresponding holes outside the display area, and
   the holes in the plurality of layers are displaced in a plan view, as compared with the matching accuracy of the outer edges.

2. The display device according to claim 1, wherein
   the uppermost layer or the lowermost layer of the plurality of layers includes a concave portion as the hole, and
   the plurality of layers except for the uppermost layer or the lowermost layer include through-holes as the holes.

3. The display device according to claim 2, wherein
   the uppermost layer or the lowermost layer is a cover glass or a housing.

4. The display device according to claim 1, wherein
   each of the plurality of layers includes a through-hole as the hole.

5. The display device according to claim 1, wherein
   the plurality of layers include at least one of a support film, a cushion sheet, and a heat equalizing sheet.

6. The display device according to claim 1, wherein
   the outer edges of the plurality of layers coincide with each other at both ends in only one of the first direction and the second direction.

7. The display device according to claim 1, wherein
   the holes in the plurality of layers are displaced in a plan view in at least one of the center and the inner surface.

8. A manufacturing method of a display device comprising:
   stacking a plurality of layers such that outer edges thereof coincide with each other at both ends in at least one of a first direction and a second direction that are orthogonal to each other, and holes at a plurality of positions included in each layer communicate with each other in the stacking direction;
   continuously filling the holes with a resin over the entirety of the plurality of layers; and
   curing the resin, wherein
   the plurality of layers include a display panel including a display area,
   the display panel includes the corresponding holes outside the display area, and
   the holes of the plurality of layers are displaced in a plan view, as compared with the matching accuracy of the outer edges.

9. The manufacturing method of a display device according to claim 8, wherein
   the resin is in a liquid, gel, or paste form in the step of filling the resin.

* * * * *